United States Patent
Xiong et al.

(10) Patent No.: US 6,190,516 B1
(45) Date of Patent: Feb. 20, 2001

(54) HIGH MAGNETIC FLUX SPUTTER TARGETS WITH VARIED MAGNETIC PERMEABILITY IN SELECTED REGIONS

(75) Inventors: Wei Xiong, New City, NY (US); Hung-Lee Hoo, Livingston, NJ (US); Peter McDonald, Suffern, NY (US)

(73) Assignee: Praxair S.T. Technology, Inc., Danbury, CT (US)

( * ) Notice: Under 35 U.S.C. 154(b), the term of this patent shall be extended for 0 days.

(21) Appl. No.: 09/413,073

(22) Filed: Oct. 6, 1999

(51) Int. Cl.[7] ................................................. C23C 14/34
(52) U.S. Cl. ................... 204/298.13; 148/306; 148/310; 148/312; 148/311; 148/313; 148/320; 148/336; 148/425; 148/426; 420/8; 420/435; 420/441; 420/459
(58) Field of Search ........................... 204/192.12, 192.2, 204/298.12, 298.13; 148/320, 336, 425, 426, 306, 310, 311, 312, 313; 420/8, 435, 441, 459

(56) References Cited

U.S. PATENT DOCUMENTS

| | | |
|---|---|---|
| 4,832,810 | 5/1989 | Nakamura et al. ............. 204/192.15 |
| 5,112,468 | 5/1992 | Weigert et al. ................. 204/298.13 |
| 5,282,946 | 2/1994 | Kinoshita et al. .............. 204/298.13 |
| 5,334,267 | 8/1994 | Taniguchi et al. .................... 148/425 |
| 5,468,305 | 11/1995 | Uchida et al. ....................... 148/120 |
| 6,033,536 | * 3/2000 | Ishihara et al. .................. 204/192.2 |

* cited by examiner

Primary Examiner—Nam Nguyen
Assistant Examiner—Steven H. VerSteeg
(74) Attorney, Agent, or Firm—Blake T. Biederman

(57) ABSTRACT

A planar ferromagnetic sputter target is provided for use as cathode in the magnetron sputtering of magnetic thin films, wherein the ferromagnetic material has localized regions of differing magnetic permeability. A solid, unitary, planar sputter target is formed from a ferromagnetic material, such as cobalt, nickel, iron or an alloy thereof, and this planar target is subjected to mechanical deformation, heat treatment, and/or thermal-mechanical treatment to create regions within the sputter target having different permeability than adjacent regions. The permeability differences in the ferromagnetic sputter target guides the path of the magnetic flux flow through the target to thereby increase the magnetic leakage flux at the target sputtering surface.

4 Claims, 4 Drawing Sheets

HIGH MAGNETIC FLUX SPUTTER TARGETS WITH VARIED MAGNETIC PERMEABILITY IN SELECTED REGIONS

FIELD OF THE INVENTION

This invention relates to ferromagnetic planar sputter targets having varied permeability regions thereby improving target performance, and method of manufacturing same.

BACKGROUND OF THE INVENTION

Sputter targets made of ferromagnetic materials are critical to thin film deposition in industries such as data storage and VLSI (very large scale integration)/semiconductors. Magnetron cathode sputtering is one means of sputtering magnetic thin films.

The cathode sputtering process involves ion bombardment of a target composed of a ferromagnetic material. The target forms part of a cathode assembly in an evacuated chamber containing an inert gas, such as argon. An electric field is applied between the cathode assembly and an anode in the chamber, and the gas is ionized by collision with electrons ejected from the surface of the cathode, forming a plasma between the target surface and the substrate. The positive gas ions are attracted to the cathode surface, and particles of material dislodged when the ions strike the target then traverse the enclosure and deposit as a thin film onto a substrate or substrates positioned on a support maintained at or near anode potential.

Although the sputtering process can be carried out solely in an electric field, substantially increased deposition rates are possible with magnetron cathode sputtering, in which an arched magnetic field, formed in a closed loop over the surface of the sputter target, is superimposed on the electric field. The arched closed-loop magnetic field traps electrons in an annular region adjacent to the surface of the target, thereby multiplying the collisions between electrons and gas atoms to produce a corresponding increase in the number of ions in that region. The magnetic field is typically created by placing one or more magnets behind the target. This produces a leakage magnetic field on the surface of the target so that the plasma density may be increased.

Erosion of particles from the sputter target surface generally occurs in a relatively narrow ring-shaped region corresponding to the shape of the closed-loop magnetic field. Only the portion of the total target material in this erosion groove, the so-called "race track" region, is consumed before the target must be replaced. The result is that typically only 18–25% of the target material is utilized. Thus, a considerable amount of material, which is generally very expensive, is either wasted or must be recycled. Furthermore, a considerable amount of deposition equipment "down-time" occurs due to the necessity of frequent target replacement.

To solve these disadvantages of the magnetron sputtering process, various possible solutions have been pursued. One potential solution is to increase the thickness of the target. If the target is relatively thick, then sputtering can proceed for a longer period of time before the race track region is consumed. Ferromagnetic materials, however, present a difficulty not encountered with non-ferromagnetic materials. For magnetron sputtering, the magnetic leakage flux (MLF) or leakage magnetic field at the target surface must be high enough to start and sustain the plasma. Under normal sputtering conditions, such as an argon pressure of 5–10 mTorr, the minimum MLF, also known as pass through flux (PTF), is approximately 150 gauss at the sputtering surface, and preferably is about 200 gauss for high speed sputtering. The cathode magnet strength in part determines the MLF. The higher the magnet strength, the higher the MLF. In the case of ferromagnetic sputter targets, however, the high intrinsic magnetic permeability of the material effectively shields or shunts the magnetic field from the magnets behind the target and hence reduces the MLF on the target surface.

For air and non-ferromagnetic materials, permeability is very close to 1.0. Ferromagnetic materials, as referred to herein, are those materials having an intrinsic magnetic permeability greater than 1.0. Magnetic permeability describes the response (magnetization) of a material under a magnetic field. In CGS units, it is defined as:

$$\text{Permeability} = 1 + 4\pi(M/H)$$

where M is the magnetization and H is the magnetic field. For currently available sputter targets, the permeability ranges from close to 1.0 to 100 or higher. The value depends on the particular material and manufacturing process. For example, a machined Co sputter target has a permeability throughout of less than about 10, whereas machined NiFe and Fe sputter targets have permeabilities throughout of greater than 20.

Because of high permeability and thus low MLF, and because MLF decreases with increasing distance from the cathode magnets, ferromagnetic sputter targets are generally made much thinner than non-magnetic sputter targets to allow enough magnetic field to be leaked out to the sputtering surface to sustain the sputtering plasma necessary for magnetron sputtering. Non-ferromagnetic targets are typically 0.25 inch thick or greater, whereas ferromagnetic targets are generally less than 0.25 inch thick. With some ferromagnetic materials, particularly those with higher permeability, the targets have to be machined to 0.0625 inch thick or less to achieve an MLF at the sputtering surface of 150 gauss, and some very high permeability materials are impossible to magnetron sputter because an MLF of 150 gauss simply cannot be achieved. Thus, not only can these ferromagnetic targets not simply be made thicker so as to reduce equipment down-time, they must actually be made thinner. To increase thickness, the MLF must somehow be increased.

U.S. Pat. No. 4,401,546 discloses a planar ferromagnetic target that achieves a thickness of 0.20 inch (5 mm) by means of a segmented target, where the segments are separated by gaps through which the magnetic field leaks to produce an MLF of 200 gauss on the surface of the target. This is described as being an improvement over conventional ferromagnetic targets that could be machined to no thicker than 0.055 inch (1.4 mm), preferably no thicker than 0.028 inch (0.7 mm), to produce an MLF of 200 gauss.

U.S. Pat. No. 4,412,907 also discloses, in the embodiment of FIG. 4, a segmented planar ferromagnetic target up to 1 inch thick (25 mm) with individual segments having sloped portions so as to produce angled gaps through which the magnetic field leaks to produce an MLF at the surface of the target of up to 730 gauss.

U.S. Pat. No. 5,827,414 discloses a planar ferromagnetic target that claims to achieve a thickness of 0.16–1.0 inch (4–25 mm), also by gaps in the target. The gaps in this configuration are radial gaps formed by slots in the target body that are perpendicular to the flux of the magnetron, thereby producing a more effective and homogeneous leakage magnetic field on and parallel to the surface of the target body so that the sputtering plasma density may be increased.

These methods of machining slots or grooves into the target body and assembling a target from individual segments so as to increase the MLF, although allowing for thicker targets, are undesirable because the gaps allow for the sputtering and deposition of foreign particles, such as from the backing plate, or severe particle generation due to the accumulation of target redeposition materials in the slotted or grooved regions. This particle generation in the thin films sacrifices the integrity of the article being coated. Furthermore, this solution of increasing target thickness by removing target material along certain patterns like grooves or slots does nothing to decrease the amount of target material waste.

In general, the higher the permeability of the ferromagnetic material, the thinner the sputter target is required to be. Such a limitation on target thickness, however, leads to a shorter target life, waste of material and a need for more frequent target replacement. Furthermore, the high permeability and low MLF of a ferromagnetic target can cause problems of high impedance, low deposition rates, narrow erosion grooves, poor film uniformity and poor film performance. It is thus desirable to provide a high MLF ferromagnetic sputter target that may be made relatively thick without sacrificing film integrity.

SUMMARY OF THE INVENTION

The present invention provides a planar ferromagnetic sputter target for use as a cathode in the magnetron sputtering of magnetic thin films, wherein the ferromagnetic material has regions of differing magnetic permeability. To this end, and in accordance with the principles of the present invention, a solid, unitary, planar sputter target is formed comprising a ferromagnetic material, such as cobalt, nickel, iron or an alloy thereof, and this planar target is subjected to a mechanical deformation technique, heat treatment and/or thermal-mechanical treatment in selected regions of the target. By this deformation and/or thermal processing, the intrinsic magnetic permeability of the material, which is at least 1.0, is lowered in deformed regions and potentially raised in thermally treated areas to create permeability differences throughout the ferromagnetic material, which results in an increase in leakage of the magnetic field at the sputtering surface. The ferromagnetic sputter targets are thus capable of starting and sustaining a plasma for magnetron sputtering.

A further feature of the present invention is the ability to increase the thickness of the planar sputter targets while still achieving a high enough magnetic flux to start and sustain the plasma, which greater thickness increases target life and decreases the frequency of target changes. Ferromagnetic targets of any ferromagnetic material may be made according to the principles of the present invention with a thickness of at least about 0.05 inch to produce a minimum MLF of about 150 gauss. The impedance of the target material is also lessened, such that higher deposition rates may be obtained or lower argon pressures may be used to obtain stable plasmas which may be maintained throughout the sputtering process.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1A:
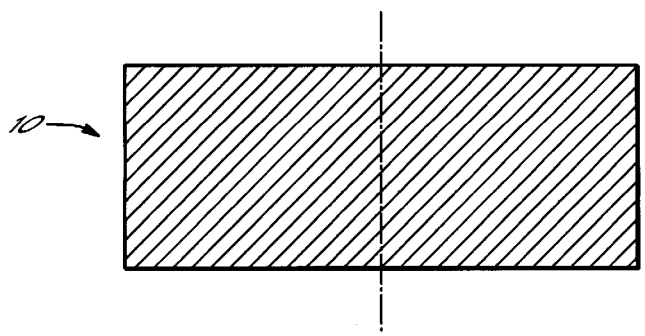
FIGS. 1A–1C depict a schematic view of a planar target configuration having even magnetic permeability throughout subjected to selective pressing to create differing permeability regions within the sputter target according to the principles of the present invention.

The present invention provides a high magnetic flux, planar, single-piece ferromagnetic sputter target. The high magnetic flux is achieved by applying deformation, heat treatment and/or thermal-mechanical treatment as described herein to achieve localized differences in magnetic permeability within the solid, unitary sputter target. By creating regions of lower magnetic permeability in the ferromagnetic material, and optionally regions of higher magnetic permeability, a significant increase in the MLF at the sputtering surface of the ferromagnetic target is achieved by virtue of eliminating the shunting of the magnetic field produced by the magnets behind the sputter target. Upon proper alignment with the cathode magnetron, the magnetic flux flow may be guided in a desired pattern to leak the magnetic field through to the regions of the sputter surface where the majority of sputtering occurs. The varied permeability regions of the ferromagnetic material further allows for an increase in target thickness, which produces a longer target life and decreases the frequency of target replacements. Varied permeability regions enable high rate depositions at an equivalent or lower magnetron field strength, which contributes to improved film magnetic properties, and the uniformity of the film thickness is improved. The varied permeability regions in the sputter target may also lead to wider sputtering erosion grooves, and hence higher target utilization, which is extremely important in reducing waste for targets made of expensive materials.

Ferromagnetic materials contemplated by the present invention include, by way of example but not limitation:

a.) Pure Co and Co-based alloys, such as CoCr, CoCrPt, CoCrTa, CoNiCr, CoCrNiTa, CoCrPtTa, CoCrPtTaNb, CoCrPtTaB, and CoCrPtTaMo, used for magnetic recording media, and CoFe, CoNiFe, CoNb, CoNbZr, CoTaZr, CoZrCr, used in magnetic recording heads;

b.) Pure Ni and Ni-based alloys, such as NiFe and NiFeCo;

c.) Pure Fe and Fe-based alloys, such as FeTa, FeCo and FeNi; and d.) Other binary, ternary, quaternary and higher degree of elemental alloys comprising Ni, Fe, Co and other elements having an intrinsic magnetic permeability of greater than 1.0.

In accordance with the principles of the present invention, a ferromagnetic material is formed into a planar, solid, unitary sputter target configuration, such as a plate, having an even permeability value throughout the material. By planar, solid, unitary sputter target is meant a flat, smooth sputtering surface with no grooves, slots or other such discontinuities in the target to create gaps for magnetic flux leakage. The sputter target is then subjected to a deformation technique, heat treatment and/or thermal-mechanical treatment as described herein to achieve localized permeability differences in the target material. The deformation is preferably applied selectively in regions in which the majority of sputtering will occur. For example, the sputter target may be deformed, such as by pressing or bending, in a pattern corresponding to the erosion grooves that will form in the sputter target during deposition. In the regions in which the target blank is deformed, the permeability of the ferromagnetic material is lower than its intrinsic value. Alternatively, the target blank may be subjected to localized heat treating in areas adjacent to the "race track" region to increase the magnetic permeability in the adjacent areas. In either method, or a combination of both, varied permeability regions are created, which increases the MLF. Preferably, the difference in magnetic permeability between regions is at least about 0.5. Thus, "high MLF" ferromagnetic targets of the present invention, as used herein, refers to sputter targets comprising a material of uniform intrinsic magnetic permeability greater than 1.0 and having one or more regions in which the magnetic permeability is greater than 1.0 but less than or greater than the intrinsic magnetic permeability of the material. The stresses and strains introduced into the material by the deformation or thermal processing, in particular by the pressing or bending of the material by the deformation process, cause a decrease or increase in the permeability of ferromagnetic materials in the treated region.

Without being bound by theory, it is believed that stress and strain introduced into the material changes the magnetic energy of the material, which in turn changes the permeability. Because uniform high permeability in a ferromagnetic target will block or shield the magnetic field from the magnets, the creation of varied permeability regions in the target material will allow the magnetic field to leak through the target material, resulting in a higher MLF on the target surface to sustain the plasma.

The deformation techniques of the present invention include any deformation process that introduces stress, stain or other microstructural or physical changes into the material to produce a localized change in magnetic permeability. The bending, compressing, stretching or other deformation action affects the target blank material in localized regions. By way of example, and not intended in any way to limit the scope of the invention, the deformation technique may be any of bending, spinning, press forming, roll forming, deep drawing, shallow drawing, deep extrusion, stamping, punching, drop hammer forming, squeezing and explosive forming. Besides these mechanical deformation techniques, the sputter target may also be treated by heat treating or thermal-mechanical treatment to create the localized regions of varied permeability. For deformation techniques effecting a bending of the material, a change preferably of about 10 degrees or greater will introduce sufficient stress and/or strain to cause a change in permeability.

Figure 1B:
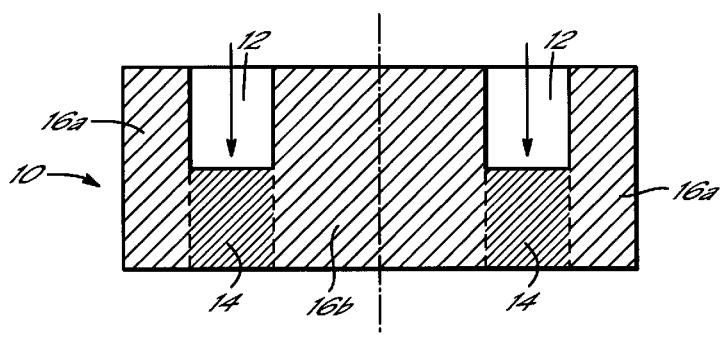
Figure 1C:
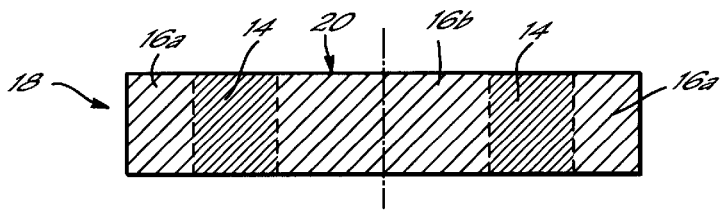
Figure 1D:
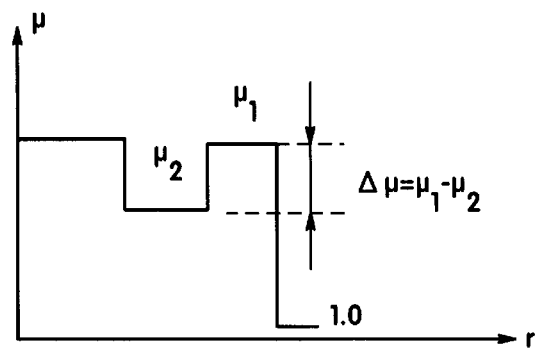
FIG. 1D depicts the permeability profile for the target of the present invention shown in FIG. 1C.

By way of example and not limitation, FIGS. 1A–1C depict in cross-section one alternative of the present invention for forming a planar ferromagnetic target with varied permeability. FIG. 1A depicts a planar, circular target blank 10 having an even permeability $\mu_1$ throughout the material. Target blank 10 may be formed from a ferromagnetic material by any known metallurgy process, such as vacuum melting/casting, hot pressing or hot-isostatic-pressing. As depicted in FIG. 1B, the sputter target blank 10 is then deformed by pressing on selected regions, in this case on region 12, which is a ring-shaped region intended to correspond to a region in which an erosion groove will form during sputtering. As a result of pressing on region 12, a compressed region 14 is formed having a permeability lower than surrounding or adjacent areas 16a,16b. The magnitude of the pressure applied on region 12 will depend on the type of material being pressed and the amount of change in permeability desired. The sputter target blank 10 is then machined down to the condensed region 14 or to a distance below the top of condensed region 14 to form a sputter target 18 having a flat, smooth surface 20 and regions of varied permeability. As shown by the permeability profile of FIG. 1D, from the center of the circular target 18 and extending outward radially, the permeability $\mu$ has a high value of $\mu_1$ in adjacent region 16b, then drops to a lower value permeability $\mu_2$ in condensed region 14, and then raises again to the higher permeability value $\mu_1$ in adjacent region 16a. Thus, a permeability difference, $\Delta\mu(\mu_1-\mu_2)$ is created in the planar ferromagnetic sputter target by inducing localized stress into the material. $\Delta\mu$ is preferably at least about 0.5 for sputter targets of the present invention.

Figure 2A:
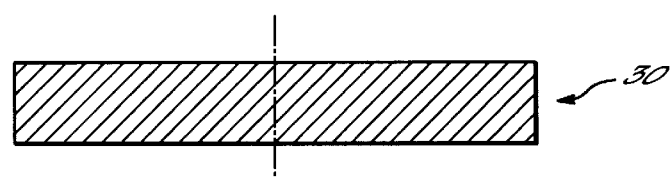
FIGS. 2A–2C depict a schematic view of a planar target configuration having even magnetic permeability throughout subjected to selective bending and flattening to create differing permeability regions in the sputter target according to the principles of the present invention.
Figure 2B:
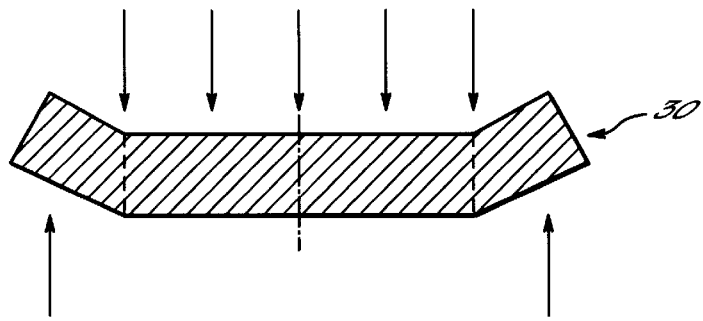
Figure 2C:
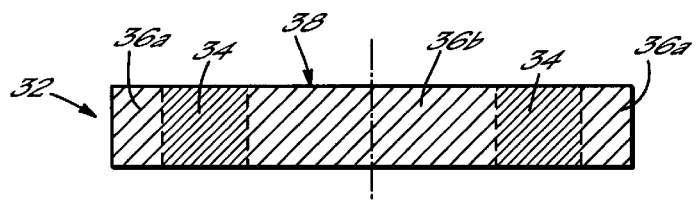
Figure 2D:
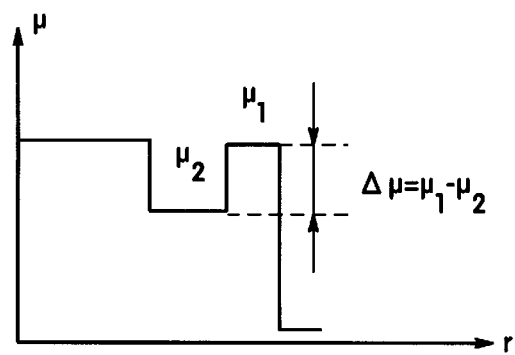
FIG. 2D depicts the permeability profile for the target of the present invention shown in FIG. 2C.

Another alternative for achieving localized permeability differences in a planar sputter target is depicted in FIGS. 2A–2C. The circular, planar sputter target blank 30 of FIG. 2A again has an even permeability $\mu_1$ throughout. As shown in FIG. 2B, the sputter target blank 30 is bent as shown by the arrows by the use of die tools (not shown) that press downward in the center of the target and upward toward the edges of the target, followed by flattening to produce the varied permeability target 32 having a ring 34 of lower permeability than surrounding or adjacent regions 36a,36b. As depicted in FIG. 2D by the permeability profile, sputter target 32, from its center and extending outward radially, has a high permeability $\mu_1$ in adjacent region 36b, a lower permeability $\mu_2$ in the region of ring 34 and the higher permeability value $\mu_1$ at the outer edge of the target at adjacent region 36a. Consequently, a localized permeability difference $\Delta\mu$ is created, which increases the MLF at the flat sputtering surface 38 of sputter target 32.

Other methods, such as heat treatment or thermal-mechanical processing may also be used to create the desired permeability difference within the ferromagnetic target. For example, a sputter target blank may be first treated, such as by heat treatment or other methods, to increase the permeability of the material first, followed by processes that lower the permeability in selected regions to thus maximize the permeability difference $\Delta\mu$. In addition, various degrees (i.e., two or more permeabilities) and patterns of localized permeability differences may be created and conveniently arranged in conjunction with the cathode magnets to maximize the effect on target leakage flux. The varied permeability regions may be formed in a pattern of ring, grids, dots or any other pattern desired.

Figure 3A:
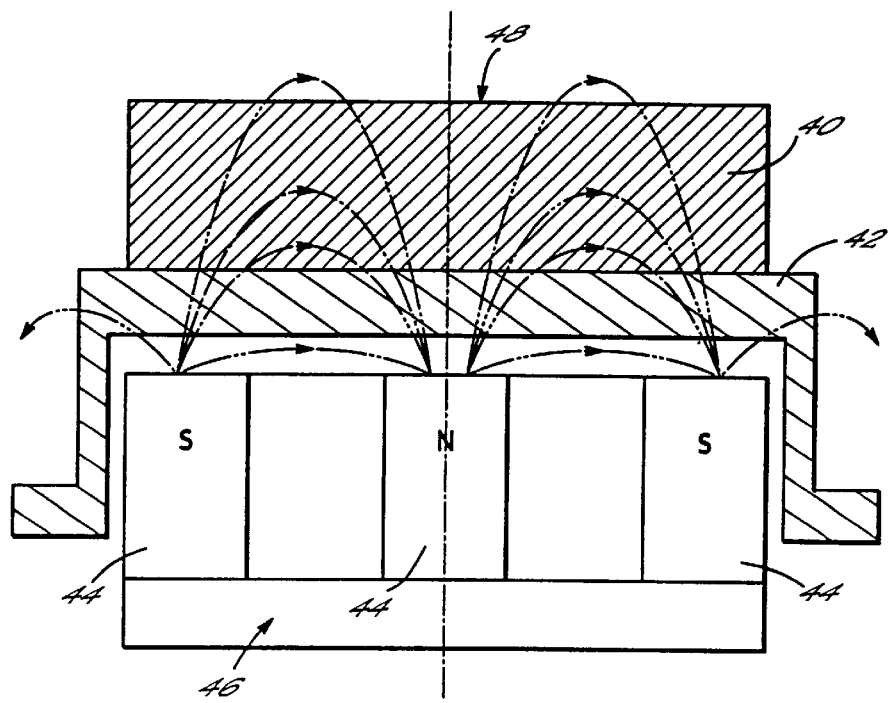
FIG. 3A depicts a cross-sectional view of a cathode assembly including a planar ferromagnetic target of the prior ale having a uniform permeability.
Figure 3B:
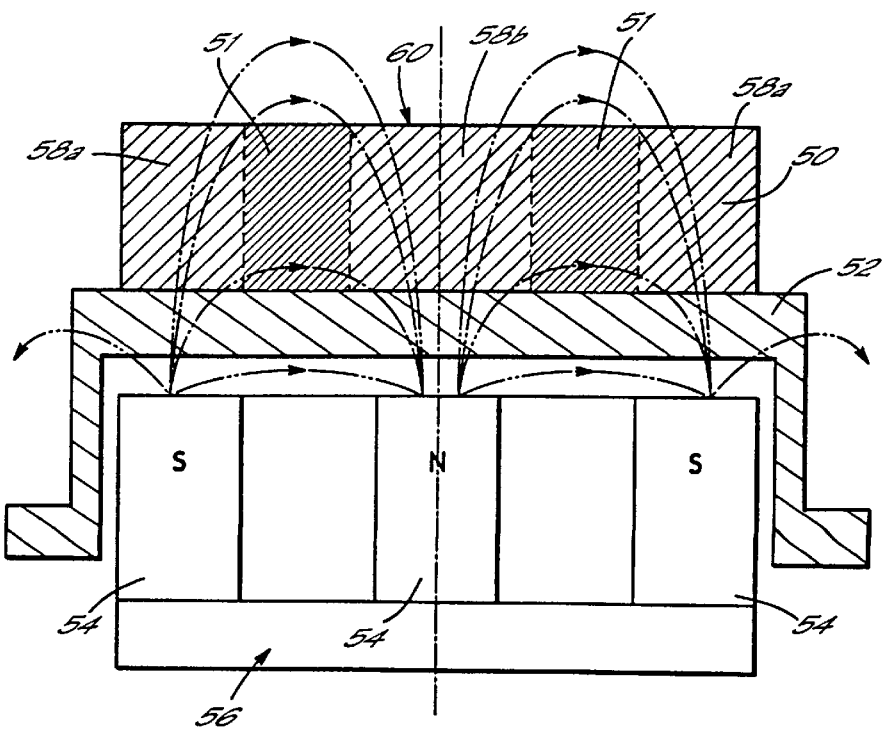
FIG. 3B depicts a cross-sectional view of a cathode assembly including a planar ferromagnetic target of the present invention having regions of differing magnetic permeability.

Without being bound by theory. FIGS. 3A and 3B are intended to demonstrate the improvement of the present invention by comparing the expected magnetic leakage flux of a prior art sputter target to the expected magnetic leakage flux of a sputter target of the present invention. In FIG. 3A, a cathode assembly using a prior art sputter target having an even permeability throughout is shown in cross-section. A sputter target 40 is attached to a backing plate 42 and the poles 44 of the magnet assembly 46 are arranged behind the backing plate 42. For this ferromagnetic target 40 having uniform permeability, the flux flow, as shown by the arrows, will consist of two major components: the vertical leakage flux flow and the horizontal shunted flux flow. As may be observed in FIG. 3A, in the prior art sputter targets, the majority of magnetic flux will be prevented from reaching the sputtering surface 48.

As depicted in FIG. 3B, a sputter target 50 of the present invention is used having varied permeability regions according to a single ring pattern, such as that created by the method described in conjunction with FIGS. 1A–1C or 2A–2C. The ring 51 of low permeability corresponds to the area in which the majority of sputtering will occur. The sputter target 50 of the present invention having the same thickness as the prior art target 40, is attached to a backing plate 52, and the poles 54 of an identical magnet assembly 56 to that used with the prior art target is arranged behind backing plate 52 in the same manner. Without being bound by theory, because the magnetic flux flow tends to follow the path of higher permeability, the leakage flux flow, as shown by the arrows, will be enhanced due to the higher permeability regions 58a,58b being arranged above the poles 54 of the magnet assembly 56, with the shunted flux flow being depressed due to the lower permeability region 51 isolating the higher permeability regions 58a,58b. The localized permeability difference created and properly aligned with the cathode magnets will produce an increase in MLF at the sputtering surface 60 in the region where the majority of sputtering will occur.

In the past, the goal for increasing MLF has been to reduce the permeability of the ferromagnetic material throughout the sputter target so that more magnetic leakage flux can be obtained at the sputtering surface. In general, for a target with the same thickness and identical magnet assembly, the more ferromagnetic the target is, or equivalently, the higher the magnetic permeability is, the more the magnetic flux flow will be shunted within the target, and therefore the less the leakage flux flow will be observed. However, the amount of permeability reduction that may be achieved throughout the ferromagnetic material is usually very limited due to the nature of ferromagnetic materials, and is also restrained by other properties, such as Curie temperature, ductility, hardness, etc. Therefore, the prior art method of reducing the permeability of the material throughout is of limited usefulness for most ferromagnetic materials, and the reduced permeability may still be too high to obtain sufficient magnetic leakage flux. According to the present invention, a limited reduction in permeability in a portion of the sputter target can be used to significantly improve target MLF. This is achieved by the selectively created localized permeability difference within a single unitary sputter target. It has been discovered that the degree of MLF improvement depends on the pattern of localized regions and the magnitude of the difference in permeability between adjacent regions. Unlike the case of even-permeability targets where lowering permeability throughout the target material is the only direction to increase MLF, the new approach of the present invention allows for maintaining or raising the permeability in certain regions while lowering the permeability in other regions. In this method, a maximum contrast in permeability between adjacent regions, preferably in combination with magnet poles being arranged behind higher permeability regions, can be achieved to maximize the effect of increased MLF at the sputter surface.

Unlike the slotted or grooved targets of the prior art, high MLF targets produced by the method of the present invention have a smooth and solid sputtering surface. The lack of grooves, slots or other machined patterns avoids potential sources of particle generation that jeopardize thin film uniformity.

By way of example and not limitation, two circular CoCrNiTa targets were processed by casting and hot rolling to achieve an even permeability through the material, as is done in the prior art. One of the targets was then further processed according to the principles of the present invention to create varied permeability regions. The even-$\mu$ CoCiNiTa target of the prior art was processed to have a peak permeability of 18.3. The $\Delta\mu$ CoCrNiTa target of the present invention was further processed by deformation with a pressing die pressing to create a low-permeability ring with peak permeability of 7.1 and surrounding high-permeability regions with maximum permeability of 18.3. In this case, a $\Delta\mu$ of 11.2 was created in the target of the present invention. Both targets of equal thickness were dc magnetron sputtered using a cathode assembly (Materials Research Corporation, Orangeburg, N.Y.) having a magnetic strength of 410 gauss without a backing plate. Both targets were then bonded onto a backing plate and installed on the cathode assembly. The flux rating showed approximately a 95% higher leakage flux in the $\Delta\mu$ CoCrNiTa target of the present invention that in the even-$\mu$ CoCrNiTa target of the prior art. Furthermore, when compared to the even-$\mu$ CoCrNiTa target of the prior art, the $\Delta\mu$ CoCrNiTa target of the present invention showed more than 50% reduction in sputtering impedance at the beginning of target life (sputtered at 6 micron argon pressure and 1 kW power). The results are provided in Table 1. Such impedance reduction is important to prevent plasma irregularity, such as arcing.

TABLE 1

Magnetic Permeability and Sputtering Impedance for CoCrNiTa Targets

|  |  | Target with even $\mu$ (0% strain) | Target with even $\mu$ (~10% strain) | Target with varied $\mu$ (partially strained) |
|---|---|---|---|---|
| Magnetic Permeability - $\mu$ |  | 18.3 | 10.3 | 7.1–18.3 |
| Starting Sputtering Impedance at 1 kW power level (ohm) |  |  |  |  |
| Target thickness 0.250 in. |  |  |  |  |
| Ar pressure (micron) | 4 | >1200 |  | 247 |
|  | 6 | 459 |  | 212 |
|  | 10 | 274 |  | 179 |
|  | 15 | 220 |  | 154 |
| Target thickness 0.200 in. |  |  |  |  |
| Ar pressure (micron) | 4 | 229 |  | 201 |
|  | 6 | 201 |  | 181 |
|  | 10 | 178 |  | 163 |
|  | 15 | 156 |  | 147 |
| Target thickness 0.180 in. |  |  |  |  |
| Ar pressure (micron) | 4 |  | 248 | 200 |
|  | 6 |  | 200 | 181 |
|  | 10 |  | 169 | 161 |
|  | 15 |  | 147 | 148 |

In addition to the even-$\mu$ target of the prior art in which 0% strain was introduced, an even-$\mu$ target with about 10% strain was also processed for comparison. As shown in Table 1, with the target thickness reduced to 0.180 inch, lower sputtering impedance of the Δμ target was evident, especially under lower argon pressure.

By changing the permeability of the ferromagnetic material in localized regions, thereby increasing the MLF at the surface of the target, the ferromagnetic sputter targets of the present invention may be made thicker than previously machined ferromagnetic targets. The magnetic field, no longer being severely shunted by high permeability throughout the target, can now leak through the thicker target material. The sputter targets of the present invention are also formed as unitary pieces, such that no foreign particles are introduced into the deposited film due to gaps in the target configuration.

The specific thicknesses and configurations of the sputter targets of the present invention will differ according to customer specifications and the particular ferromagnetic material used. In general, any target of any configuration and material may be made thicker if deformed according to the principles of the present invention. The present invention is of particular benefit in the production of nickel-based and iron-based targets in which the magnetic permeability of the starting material is so high that an MLF of 150 gauss could not previously be achieved and so magnetron sputtering could not be used, or those targets which had to be machined to very thin dimensions to allow sufficient leakage of the magnetic field. The materials are now capable of being formed into relatively thick targets that can leak sufficient magnetic field to start and sustain the plasma, and even higher amounts to increase the deposition rate, with the same magnetron field strength.

Figure 4:
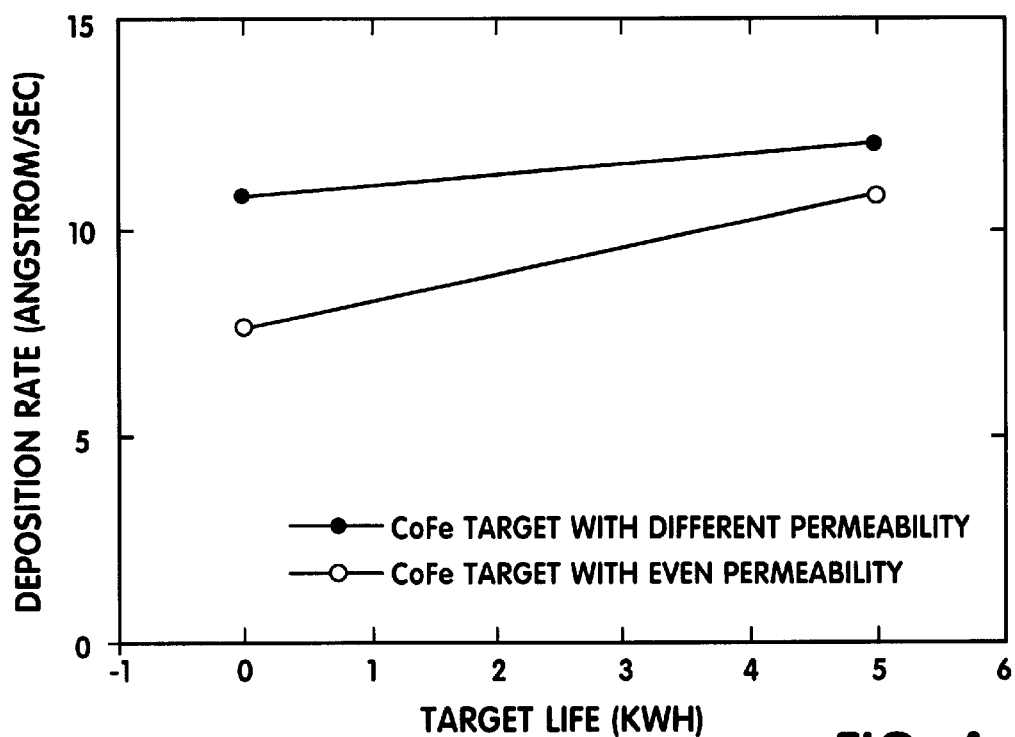
FIG. 4 is a plot of deposition rate vs. target life for CoFe targets of the present invention and the prior art.

As demonstrated in the plot of FIG. 4, the high MLF targets of the present invention enable higher rates of deposition with the same or lower magnetron field strength. For an equivalent target life of 5 kilowatt hours, the CoFe target of varied permeability was sputtered at a higher deposition rate in angstroms per second than the CoFe target having even permeability. High-rate deposition is found in many cases helpful to improve film magnetic properties. Low permeability targets also lead to more uniform film thickness and wider sputtering erosion grooves and hence higher target utilization. Thus, the targets of the present invention decrease the frequency of target replacement and reduce target material waste, in addition to providing uniform, high purity magnetic thin films.

Figure 5:
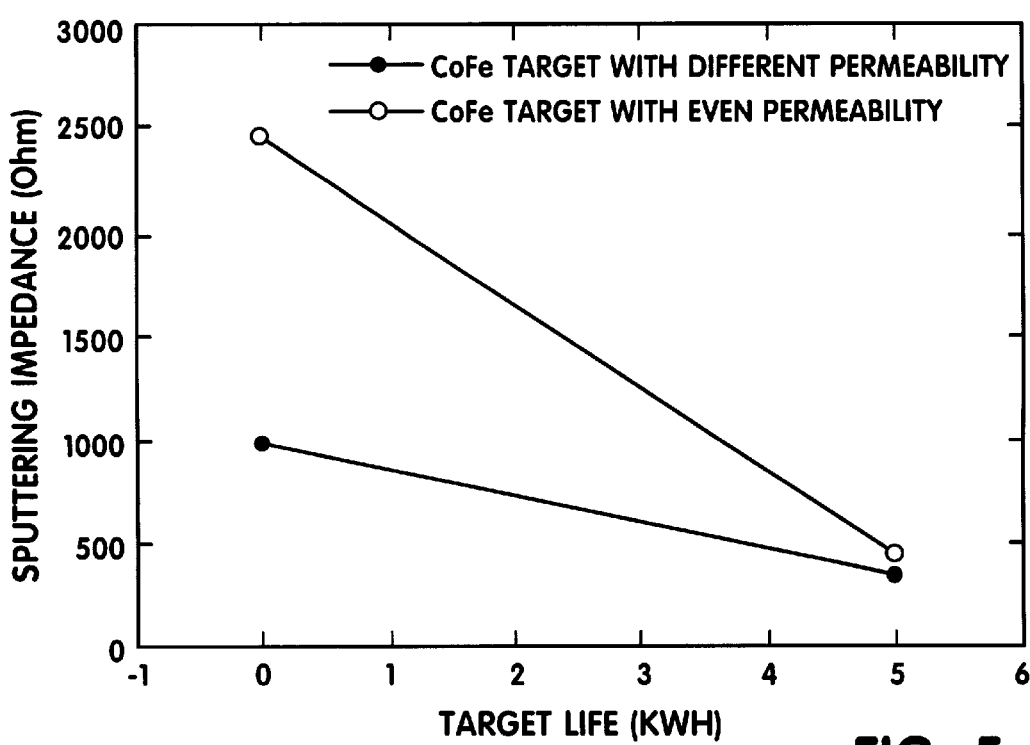
FIG. 5 is a plot of sputtering impedance vs. target life for CoFe targets of the present invention and the prior art.

An additional benefit of the present invention, shown by the plot of FIG. 5, is that with an increase in the MLF of the target there is a corresponding decrease in sputtering impedance, which likewise decreases the minimum argon pressure necessary for obtaining a stable plasma. The CoFe target having varied permeability displayed low sputtering impedance throughout the target life, whereas the CoFe target having even permeability did not achieve low sputtering impedance until the very end of the target's life. High impedance causes plasma arcing, which may render the plasma unstable, making the target more difficult to sputter. By lowering the impedance of the targets of the present invention, a stable plasma may be obtained and maintained throughout the sputtering process at lower minimum argon pressures.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, while specific examples of deformation and thermal treatment have been provided, it is to be understood that any treatment or combination of treatments may be used that result in adjacent regions having different magnetic permeabilities. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A planar ferromagnetic sputter target for use in magnetron cathode sputtering comprising a solid, unitary ferromagnetic material having a ring-shaped first region and a second region adjacent the first region, the ferromagnetic material selected from the group consisting of: Co, Co-base alloys, Ni, Ni-base alloys, Fe and Fe-base alloys, the first region having at least a 0.5 lower magnetic permeability than the second region.

2. The sputter target of claim 1 wherein the ferromagnetic material has an intrinsic magnetic permeability greater than 1.0 and the first region is a deformed region having a magnetic permeability lower than the intrinsic magnetic permeability of the material.

3. The sputter target of claim 2, wherein the second region is thermally treated and has a magnetic permeability higher than the intrinsic magnetic permeability of the ferromagnetic material.

4. The sputter target of claim 1 wherein the ferromagnetic material is selected from the group consisting of: Co, CoCr, CoCrPt, CoCrTa, CoNiCr, CoCrNiTa, CoCrPtTa, CoCrPtTaNb, CoCrPtTaB, CoCrPtTaMo, CoFe, CoNiFe, CoNb, CoNbZr, CoTaZr, CoZrCr, Ni, NiFe, NiFeCo, Fe, FeTa, FeCo and FeNi.

* * * * *